United States Patent [19]
Akimoto

[11] Patent Number: 6,027,262
[45] Date of Patent: Feb. 22, 2000

[54] RESIST PROCESS METHOD AND SYSTEM

[75] Inventor: Masami Akimoto, Kumamoto-ken, Japan

[73] Assignee: Tokyo Electron Limited, Tokyo, Japan

[21] Appl. No.: 08/921,350

[22] Filed: Aug. 29, 1997

[30] Foreign Application Priority Data

Sep. 3, 1996 [JP] Japan ..................................... 8-252316

[51] Int. Cl.[7] ............................... G03D 5/00; G03D 3/08; B65G 25/00
[52] U.S. Cl. ........................... 396/611; 396/624; 414/152
[58] Field of Search ............................. 355/27; 396/611, 396/612, 624; 414/152, 225; 134/149, 153

[56] References Cited

U.S. PATENT DOCUMENTS

| | | | |
|---|---|---|---|
| 5,361,449 | 11/1994 | Akimoto et al. | 134/149 |
| 5,664,254 | 9/1997 | Ohkura et al. | 396/612 |
| 5,826,129 | 10/1998 | Hasebe et al. | 396/611 |
| 5,844,662 | 12/1998 | Akimoto et al. | 355/27 |

*Primary Examiner*—David M. Gray
*Assistant Examiner*—Peter Kim
*Attorney, Agent, or Firm*—Oblon, Spivak, McClelland, Maier & Neustadt, P.C.

[57] ABSTRACT

A resist process method includes the steps of, preparing a process section for processing a wafer, means for extracting the wafer from a cassette and conveying the substrate to the process section, a cleaning section for finally cleaning the wafer processed by the process section, means for transferring the wafer from the process section to the cleaning section, and means for receiving the wafer from the cleaning section and storing the wafer in a cassette, extracting the wafer from the cassette, conveying the extracted wafer to the process section, causing the process section to include at least a process of developing the resist coated onto the wafer, transferring the wafer from the process section to the cleaning section after at least the developing process, finally cleaning the non-resist coated surface of the wafer by applying a cleaning solution to at least the non-resist coated surface of the substrate in the cleaning section, and storing the finally cleaned wafer in the cassette.

16 Claims, 6 Drawing Sheets

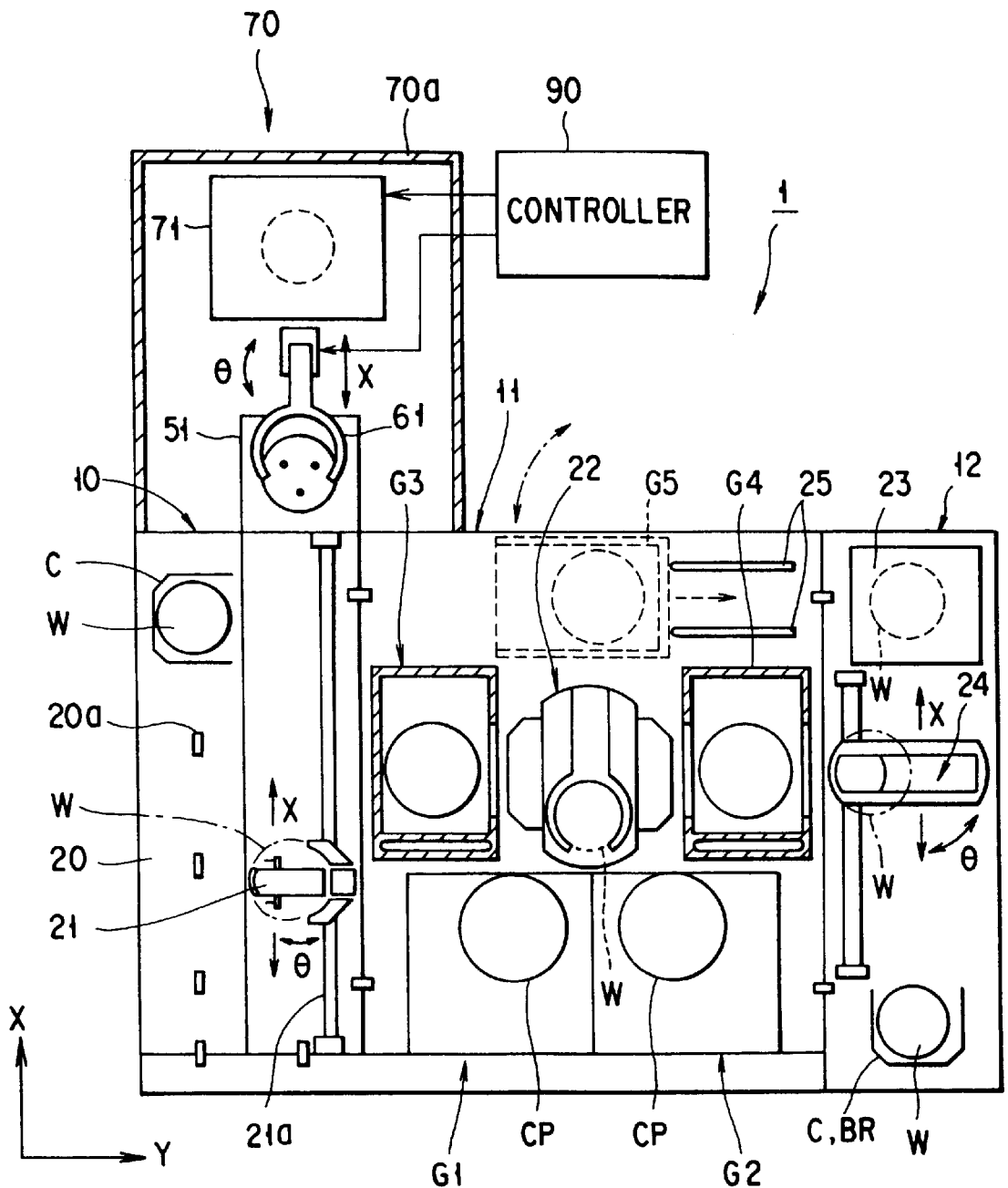
F I G. 1

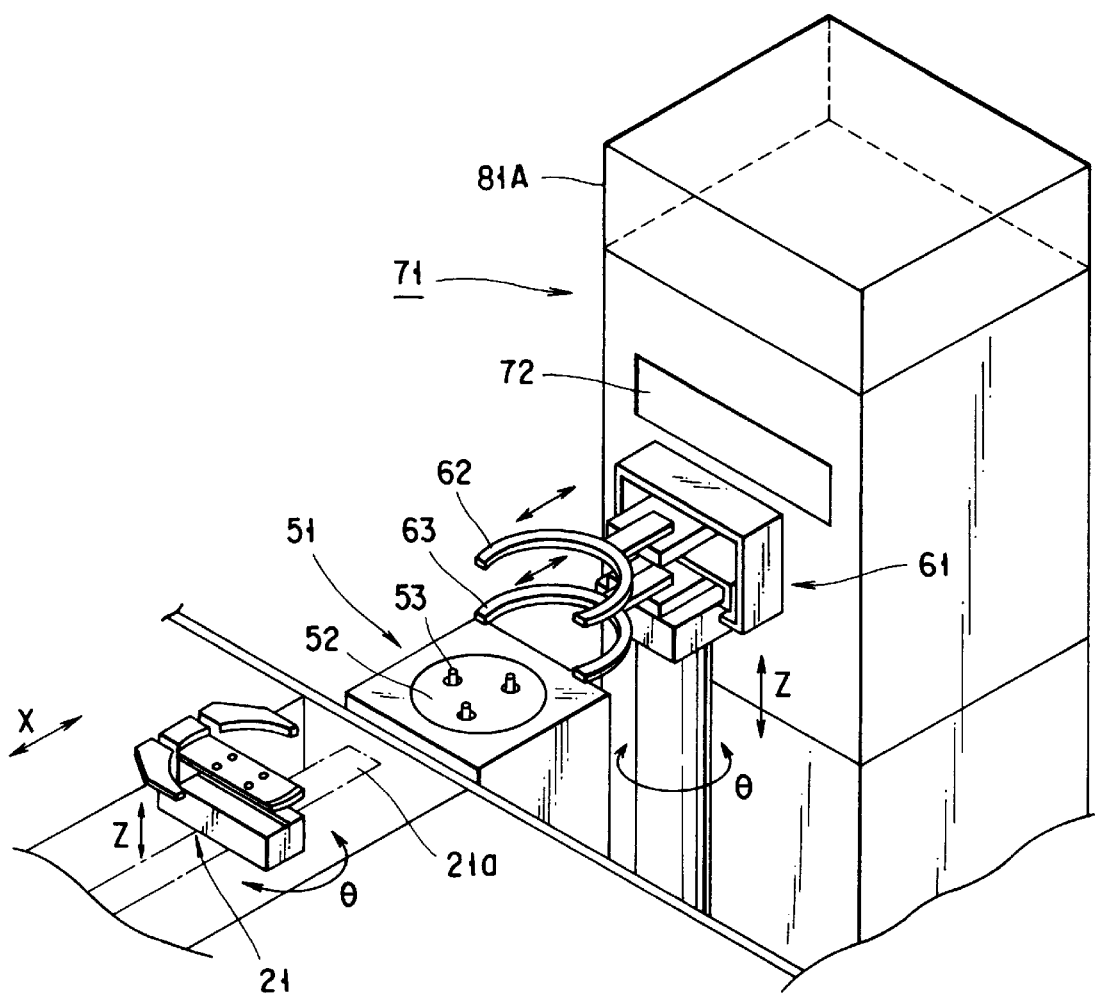
F I G. 5

RESIST PROCESS METHOD AND SYSTEM

BACKGROUND OF THE INVENTION

The present invention relates to a resist process method and system for coating a substrate such as a semiconductor wafer with a resist solution, and developing the resist coating.

In a photolithographic process, a resist process system is used to sequentially coat semiconductor wafers with a resist solution, and develop the resist coatings. Such resist process systems are disclosed in U.S. patent Ser. Nos. 08/667,712 and 08/686,707. In these resist process systems, wafers are conveyed to the respective process units by using a plurality of arm mechanisms to be sequentially processed. When a series of processes are complete, the wafers are stored in a cassette in a cassette station, and are conveyed outside the system together with the cassette.

During these processes and conveyance, various types of foreign substances may adhere to wafers. Foreign substances, e.g., a developing solution, particles, various types of organic substances, and various types of ions are likely to adhere to the rear surfaces of wafers, in particular. U.S. patent Ser. No. 08/521,845 discloses an apparatus and method which prevent contamination of the rear surfaces of wafers during a developing process. This conventional technique is designed to only prevent contamination of the rear surface of a wafer during a developing process, but cannot remove foreign substances adhering to the rear surface of the wafer after the developing process. If, for example, a resist solution or developing solution adheres to the holder of an arm mechanism for some reason, these substances are transferred to the rear surface of a wafer, and the contaminated wafer is stored in a cassette as it is. In addition, particles floating in the system may adhere to the processed wafer, and the contaminated wafer may be stored in a cassette as it is.

The resist process system also uses chemical filters to remove organic components from the atmosphere in the system. A chemical filter is expensive and demands frequent replacement of elements. For this reason, in a resist process system, the quantity of chemical filters used is preferably minimized. In the conventional resist process system, however, since chemical filters are provided for a brush cleaning device and a water cleaning device which are irrelevant to organic components, the quantity of chemical filters used in the system is large as a whole.

BRIEF SUMMARY OF THE INVENTION

It is an object of the present invention to provide a resist process method and system which can finally remove foreign substances which adhere to a substrate during conveyance or processes of the substrate, and decrease the quantity of chemical filters.

A resist process method according to the present invention is characterized by comprising the steps of, (a) preparing a process section for processing a substrate, means for extracting the substrate from a cassette and conveying the substrate to the process section, a cleaning section for finally cleaning the substrate processed by the process section, means for transferring the substrate from the process section to the cleaning section, and means for receiving the substrate from the cleaning section and storing the substrate in a cassette, (b) extracting the substrate form the cassette, (c) conveying the extracted substrate to the process section, (d) causing the process section to include at least a process of developing the resist coated onto the substrate (e) transferring the substrate from the process section to the cleaning section after at least the developing process, (f) finally cleaning a non-resist coated surface of the substrate by applying a cleaning solution to at least the non-resist coated surface of the substrate in the cleaning section, and (g) storing the finally cleaned substrate in the cassette.

A resist process apparatus according to the present invention is characterized by a resist process apparatus comprising a cassette section into/from which a cassette containing a plurality of substrates is loaded/unloaded, a process section including at least developing means for developing the resist coated on the substrate, first air-conditioning means for forming a down flow of clean air in the process section, a main arm mechanism for sequentially conveying the substrate in the process section, a sub-arm mechanism for extracting the substrates from the cassette of the cassette section one by one and directly or indirectly transferring the substrate to the main arm mechanism, a final cleaning section which is installed in a place different from a place where the process section is installed and performs a final cleaning process for the substrate by spraying a cleaning solution against the substrate, second air-conditioning means for forming a down flow of clean air in the final cleaning section, and substrate transfer means for directly or indirectly transferring the substrate between the final cleaning section and the sub-arm mechanism, wherein the substrate transfer means transfers the substrate having undergone a process in the process section to the final cleaning section before the substrate is stored in the cassette of the cassette section, at least a non-resist coated surface of the substrate is cleaned by spraying a cleaning solution against the non-resist coated surface, and the cleaned substrate is stored in the cassette of the cassette section.

According to the resist process method of the present invention, even if, for example, a resist solution, a developing solution, particles, and the like adhere to a substrate during conveyance or a process, since the substrate undergoes a final cleaning process, the substrate is stored in a cassette in a clean state.

Since no chemical filter is required for the final cleaning section, the quantity of chemical filters used in the system decreases as a whole.

The final cleaning section may include a single cleaning device or a plurality of juxtaposed cleaning devices. If the final cleaning section includes a plurality of juxtaposed cleaning devices, many substrates can be concurrently processed, resulting in an increase in throughput.

In addition, since the transfer mount base can be used as a place where the substrate to be processed is temporarily held in a standby state, a series of processes can be flexibly performed, resulting in an increase in throughput. If such transfer mount bases are arranged horizontally or vertically, many substrates can be easily processed concurrently.

Since the transfer arm mechanism (third sub-arm mechanism) can have a simpler structure than the main arm mechanism of the process section, the amount of dust generated (the amount of particles generated) is small.

In this case, "directly or indirectly transferring the substrate" means directly transferring the substrate from one arm mechanism to the other arm mechanism and indirectly transferring the substrate from one arm mechanism to the other arm mechanism through a transfer mount base or the like.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view schematically showing a resist process system according to an embodiment of the present invention;

FIG. 5 is a perspective view showing a transfer section, a third sub-arm mechanism, and a cleaning device mounted on a side portion of the system main body.

DETAILED DESCRIPTION OF THE INVENTION

Various preferred embodiments of the present invention will be described below with reference to the accompanying drawing. An embodiment in which the present invention is applied to a coating/developing system for coating a semiconductor wafer with a chemical sensitization type resist and developing the resist will be described below.

Figure 2:
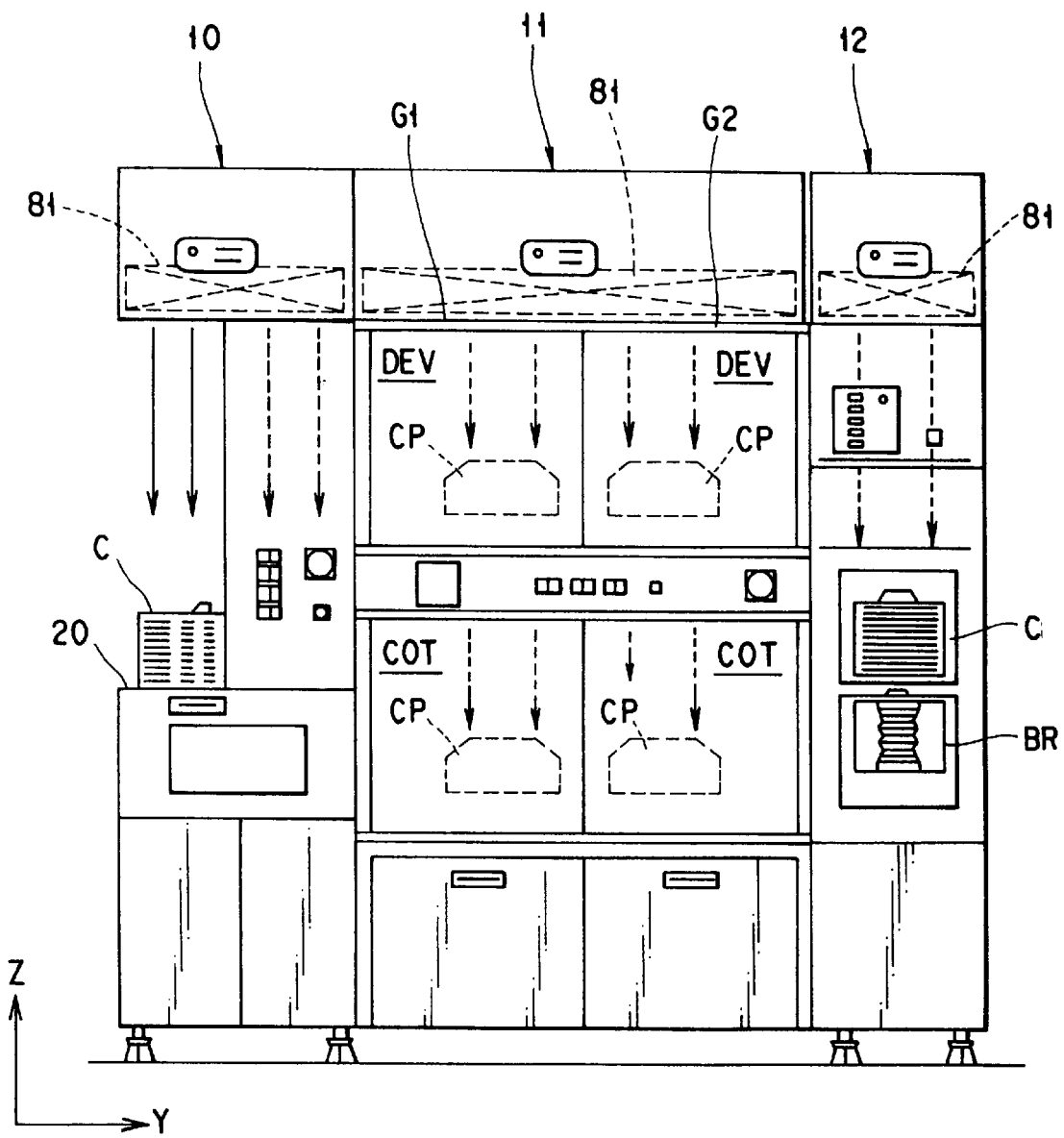
FIG. 2 is a front view of the resist process system.

As shown in FIGS. 1 and 2, a coating/developing system 1 includes a cassette station 10, a process station 11, an interface section 12, first and second sub-arm mechanisms 21 and 24, and a main arm mechanism 22. The coating/developing system 1 is installed in an air-conditioned clean room.

The cassette station 10 has a cassette mount base 20. A plurality of cassettes C are mounted on the cassette mount base 20. Wafers W corresponding to one lot are stored in each cassette C. One lot is constituted by 25 or 13 wafers. The wafer W is extracted from the cassette C by the first sub-arm mechanism 21 and loaded into the process station 11.

As shown in FIG. 1, the process station 11 includes five process unit groups G1 to G5. The process units of each of the groups G1 to G5 are vertically arranged in a multistage form. The wafers W are loaded/unloaded one by one into/from each process unit by the main arm mechanism 22. The interface section 12 is arranged between the process station 11 and an exposure device (not shown). The wafer W is loaded/unloaded into/from the exposure device by the sub-arm mechanism 24.

Four projections 20a are formed on the cassette mount base 20. The cassettes C are positioned on the cassette mount base 20 by the projections 20a. The cassette C loaded into the cassette station 10 has a cover (not shown). The cassette C is mounted on the cassette mount base 20 with the cover facing the process station 11.

The process station 11 includes the five process unit groups G1 to G5. The first and second process unit groups G1 and G2 are arranged on the front surface side of the system. The third process unit group G3 is placed next to the cassette station 10, and the fourth process unit group G4 to the interface section 12. The fifth process unit group G5 is placed on the rear surface side of the system.

As shown in FIG. 2, in the first process unit group G1, two spinner type process units for performing predetermined processes with respect to wafers W mounted on spin chucks in cups CP, e.g., a resist coating unit (COT) and a developing unit (DEV), are sequentially stacked upward. In the second process unit group G2, two spinner type process units, e.g., a resist coating unit (COT) and a developing unit (DEV), are sequentially stacked upward. These resist coating units (COT) are preferably placed on the lower stage to facilitate liquid waste discharging operations.

Figure 3:
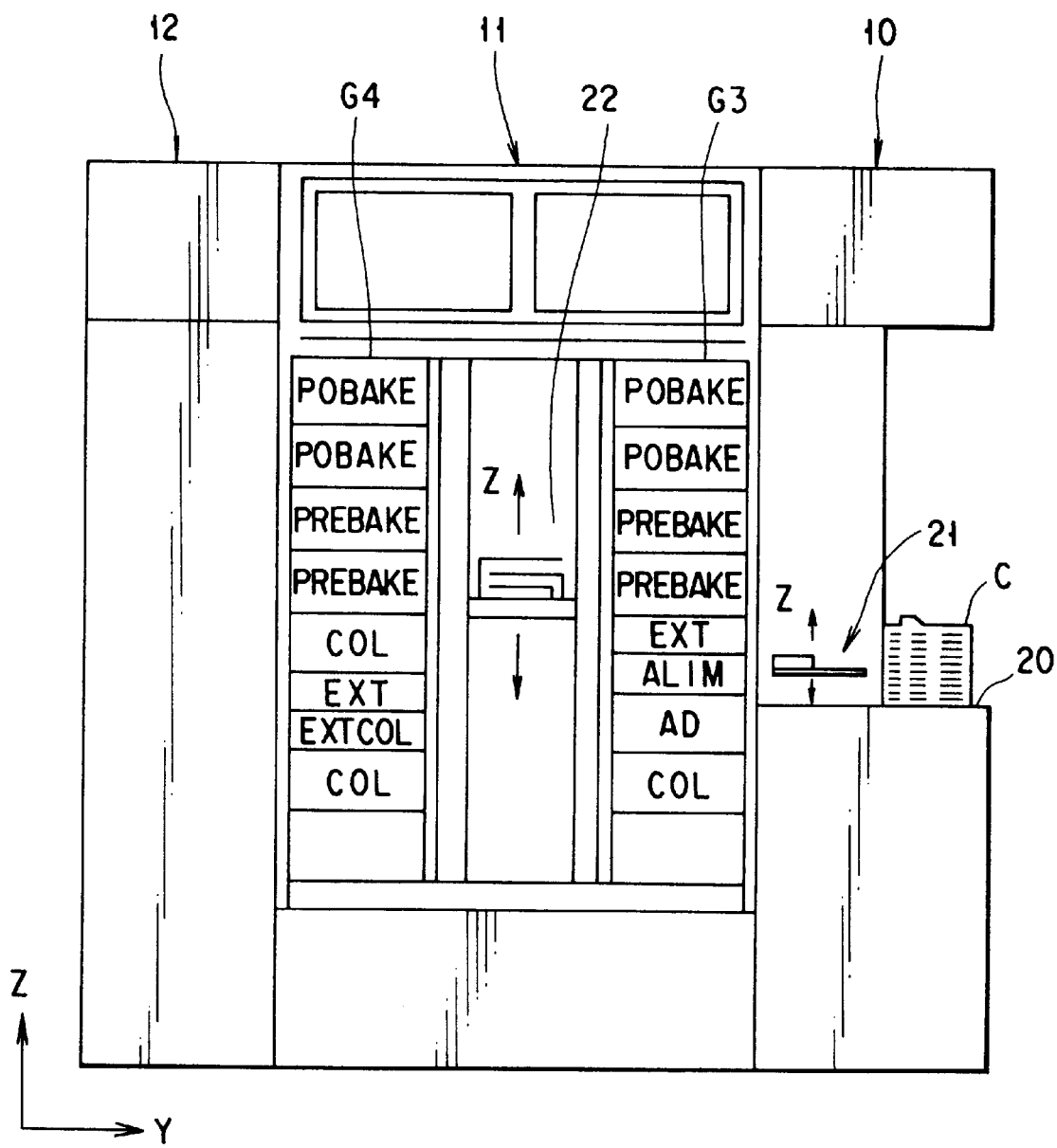
FIG. 3 is a rear view of the resist process system.

As shown in FIG. 3, in the third process unit group G3, for example, a cooling unit (COL), an adhesion unit (AD), an alignment unit (ALIM), an extension unit (EXT), prebaking units (PREBAKE) and post-baking units (POBAKE). In the fourth process unit group G4 as well, for example, a cooling unit (COL), an extension/cooling unit (EXTCOL), an extension unit (EXT), a cooling unit (COL), prebaking units (PREBAKE), postbaking units (POBAKE), and an adhesion unit (AD; not shown) are sequentially stacked upward.

In this manner, the cooling unit (COL) and the extension cooling unit (EXTCOL), in which the process temperatures are low, are arranged on the lower stage side, whereas the prebaking units (PREBAKE), the postbaking units (POBAKE), and the adhesion unit (AD), in which the process temperatures are high, are arranged on the upper stage side, thereby reducing thermal interference between the process units.

Upon reception of a wafer W from the first sub-arm mechanism 21, the main arm mechanism 22 conveys the wafer W to the alignment unit (ALIM) and the extension unit (EXT) belonging to the third process unit group G3 in the process station 11.

The interface section 12 is almost equal in size in the X-axis direction to the process station 11, but is smaller in size in the Y-axis direction than the process station 11. A detachable pickup cassette C and a non-detachable buffer cassette BR are stacked in the front surface portion of the interface section 12, whereas a peripheral exposure device 23 is placed in the rear surface portion of the interface section 12. In addition, the second sub-arm mechanism 24 is mounted in the central portion of the interface section 12. The second sub-arm mechanism 24 has the same arrangement as that of the first sub-arm mechanism 21, and can access the extension unit (EXT) belonging to the fourth process unit group G4, and a wafer transfer table (not shown) on the adjacent exposure unit side.

In the coating/developing system 1, the fifth process unit group G5 can be arranged on the rear surface side of the main arm mechanism 22. The fifth process unit group G5 can move in the Y-axis direction along guide rails 25. The fifth process unit group G5 is moved to ensure a space where maintenance and inspection are performed for the main arm mechanism 22 from the rear side.

Figure 4:
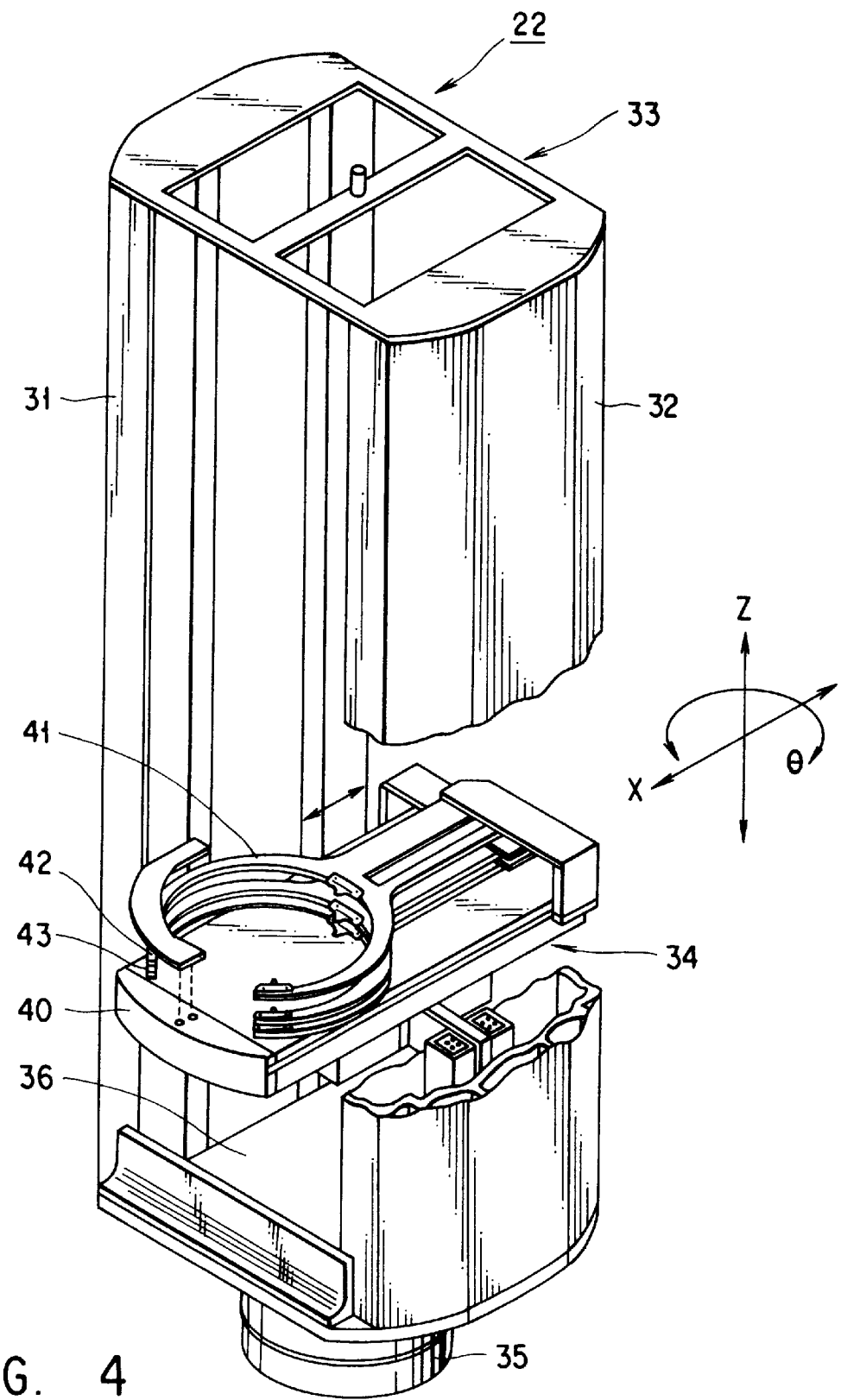
FIG. 4 is a partly cutaway perspective view of a main arm mechanism.

The main arm mechanism 22 will be described next with reference to FIG. 4.

The main arm mechanism 22 has a holder moving section 34 in a cylindrical support member 33 constituted by a pair of vertical walls 31 and 32 which are connected to each other at the upper and lower ends to oppose each other. The holder moving section 34 can move up and down in the Z-axis direction. Since the cylindrical support member 33 is coupled to the rotating shaft of a motor 35, the cylindrical support member 33 and the holder moving section 34 are integrally rotated, thereby performing θ rotation of the holder moving section 34 about the Z-axis.

The holder moving section 34 includes a convey base 40 and three holders 41, 42, and 43 arranged vertically in a multistage form. The three holders 41, 42, and 43 are arranged above the convey base 40. Each of the holders 41, 42, and 43 has a shape and a size that allow it to pass through a side surface opening portion 36 between the vertical walls 31 and 32 of the cylindrical support member 33. These holders are designed to be independently moved forward and backward by driving motors (not shown) and belts (not shown) incorporated in the convey base 40.

The holders 41, 42, and 43 are arranged vertically such that the interval between the uppermost holder 41 and the second holder 42 is larger than the interval between the second holder 42 and the lowermost holder 43. Such an arrangement is employed to prevent the thermal interference between the wafers W held by the uppermost holder 41 and the second holder 42 from adversely affecting the process for wafers W. Therefore, the uppermost holder 41 is normally used to execute a resist coating process after a cooling process. The second holder 42 and the lowermost holder 43 are used to convey wafers W which are free from the adverse effect of such thermal interference. To improve the thermal interference preventing effect, for example, a thermal insulating board (not shown) may be placed between the uppermost holder 41 and the second holder 42.

A transfer mount base 51 is placed near an end portion of a convey path 21a of the first sub-arm mechanism 21. The transfer mount base 51 is placed in a space different from the spaces where the first to fifth process unit groups G1 to G5 and the main arm mechanism 22 are arranged. More specifically, as shown in FIG. 1, the transfer mount base 51 is surrounded by housing 70a of a cleaning section 70. A final cleaning device 71 is placed in the housing 70a. As shown in FIG. 5, an air-conditioning device 81A is mounted on the upper portion of the final cleaning device 71. The air-conditioning device 81A includes a ULPA filter and a fan. The ULPA filter has a physical filtering function and hence can catch and remove fine particles.

The transfer mount base 51 has three support pins 53 which can retract/protrude from an upper surface member 52. A wafer can be mounted on the protruding support pins 53. The first sub-arm mechanism 21 can mount a wafer on the protruding support pins 53 or receive a wafer on the support pins 53.

A third sub-arm mechanism 61 that forms another convey means of the present invention is placed on the rear surface side of the transfer mount base 51, i.e., an extended line along the X-axis direction. The third sub-arm mechanism 61 has upper and lower holders 62 and 63 for directly holding the wafers W. These holders 62 and 63 can independently move forward and backward. The third sub-arm mechanism 61 can be moved in the Z-axis direction by a vertically driving mechanism (not shown). The θ rotation of the third sub-arm mechanism 61 about the Z-axis is allowed by a θ rotation driving mechanism (not shown). As described above, each of the holders 62 and 63 of the third sub-arm mechanism 61 can mount a wafer W on the support pins 53 of the transfer mount base 51 and receive a wafer W on the support pins 53.

The final cleaning device 71 incorporates a rotating mechanism (not shown) for spinning the wafer W and nozzles (not shown) for spraying high-pressure water jets against the wafer W. In addition, a convey port 72 is formed in the front surface side of the final cleaning device 71. The wafer W is loaded/unloaded into/from the final cleaning device 71 by the third sub-arm mechanism 61 through the convey port 72.

As shown in FIG. 2, filter devices 81 are arranged above the first to fifth process unit groups G1 to G5 and the interface section 12. The filter devices 81 are respectively arranged above the first zone (cassette station 10), the second zone (process station 11), and the third zone (interface section 12). Each filter device 81 includes one or both of a chemical filter element and a ULPA filter element. Each filter device 81 also includes a fan (not shown). Clean air is supplied to the sections 10, 11, and 12 from above by these filter devices 81 to form down flows separately. In addition, down flows of clean air are separately formed in the resist coating unit (COT) and the developing unit (DEV) which generate organic components in the process unit.

Figure 6:
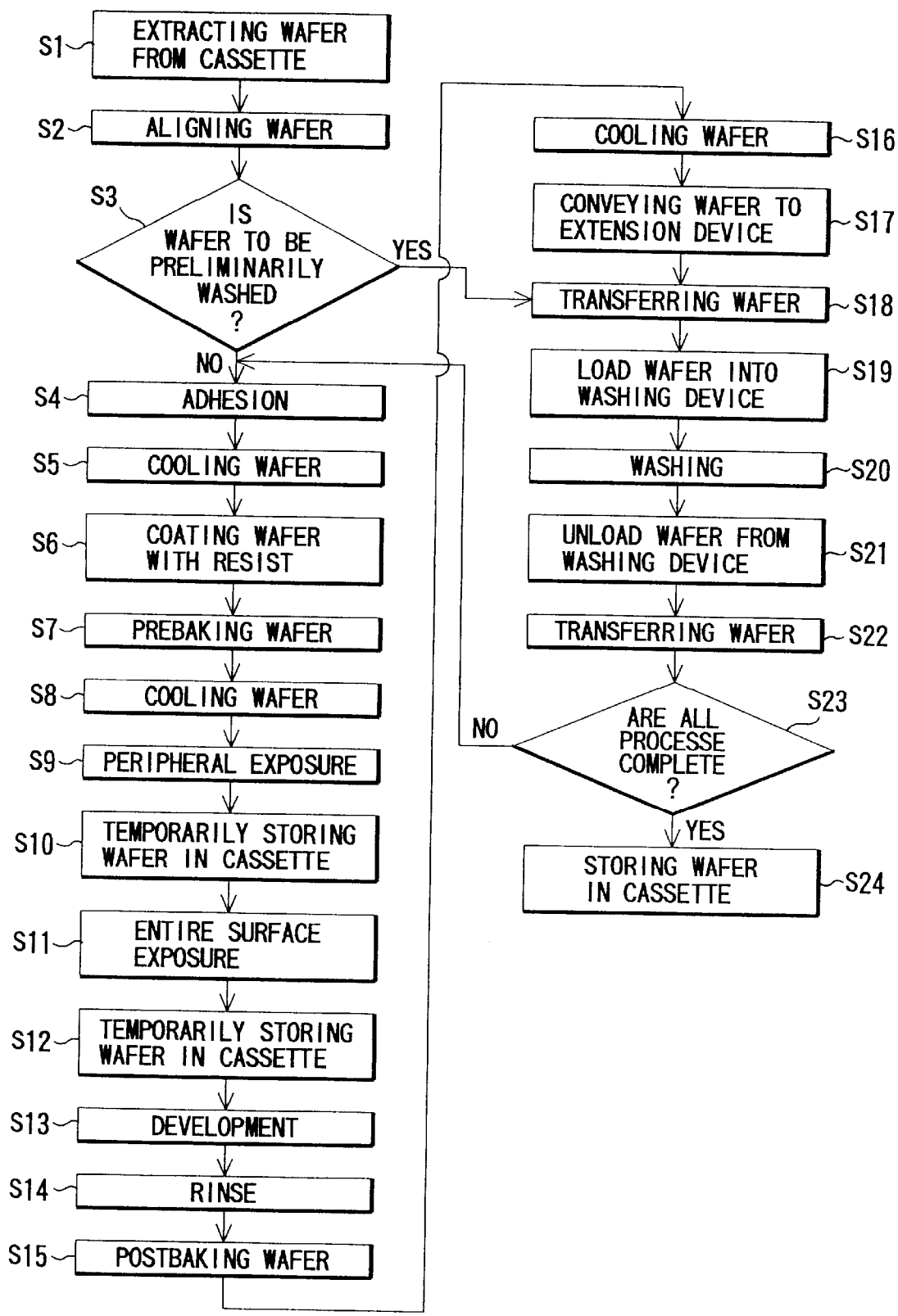
FIG. 6 is a flow chart showing a resist process method according to an embodiment of the present invention.

A resist process method for the wafers W will be described next with reference to the flow chart of FIG. 6.

A cassette C is mounted on the cassette mount base 20. A plurality of unprocessed wafers W are stored in the cassette C. The first sub-arm mechanism 21 accesses the cassette C and extracts one wafer W therefrom (step S1).

The first sub-arm mechanism 21 moves to the alignment unit (ALIM) of the third process unit group G3, and transfers the wafer W into the alignment unit (ALIM). The alignment unit (ALIM) aligns the orientation flat of the wafer W in a desired direction, and centers the wafer W. With this operation, the wafer W is positioned with respect to the cleaning section 70 of the process station 11 (step S2). After the wafer W is positioned, a controller 90 determines on the basis of predetermined process input data whether the wafer W is preliminarily cleaned (step S3).

If YES in step S3, the first sub-arm mechanism 21 conveys the wafer W from the alignment unit (ALIM) to the cleaning section 70, and the wafer W is preliminarily cleaned according to steps S18 to S22 to be described later. More specifically, the first sub-arm mechanism 21 conveys the wafer W from the alignment unit (ALIM) to the transfer mount base 51, and mounts it on the transfer mount base 51 (step S18). The third sub-arm mechanism 61 then loads the wafer W from the transfer mount base 51 into the final cleaning device 71 (step S19). The wafer W is preliminarily cleaned in the final cleaning device 71. In this preliminary cleaning process, high-pressure water jets are sprayed against the upper and lower surfaces of the wafer W to clean these surfaces (step S20). After the preliminary cleaning process, the third sub-arm mechanism 61 unloads the wafer W from the final cleaning device 71 (step S21), and mounts it on the transfer mount base 51 (step S22). The controller 90 determines that the processes for the wafer W are not complete yet (step S23). With this determination, the first sub-arm mechanism 21 transfers the wafer W to the main arm mechanism 22. The main arm mechanism 22 sequentially conveys the wafer W to the respective process units in the process station 11 to perform resist processes for the wafer W in accordance with steps S4 to S17 to be described later.

If NO in step S3, the main arm mechanism 22 accesses the alignment unit (ALIM) to extract the wafer W therefrom, and conveys the wafer W to the adhesion unit (AD). The adhesion unit (AD) performs an adhesion process for the wafer W (step S4). In this adhesive process, the wafer W is heated.

The main arm mechanism 22 conveys the wafer W to the cooling unit (COL) belonging to the third or fourth process unit group G3 or G4. The cooling unit (COL) cools the wafer W to a set temperature (23° C.) (step S5). In addition, the main arm mechanism 22 unloads the wafer W from the cooling unit (COL) by using the upper holder 41, and at the same time, loads the next wafer W (another wafer W) into the cooling unit (COL) by using the intermediate holder 42.

The main arm mechanism 22 loads the wafer W into the resist coating unit (COT) belonging to the first or second process unit group G1 or G2. In the resist coating unit (COT), one surface of the wafer W is coated with a resist solution (step S6).

The main arm mechanism 22 conveys the wafer W from the resist coating unit (COT) to the prebaking unit (PREBAKE). In the prebaking unit (PREBAKE), the wafer W is heated at about 100° C. for a predetermined period of time (step S7).

The main arm mechanism 22 then conveys the wafer W from the prebaking unit (PREBAKE) to the extension cooling unit (EXTCOL) belonging to the fourth process unit group G4. In the extension cooling unit (EXTCOL), the wafer W is cooled to about 24° C. (step S8). As the target temperature in this cooling step (step S8), a temperature suitable for a peripheral exposure process in step S9 is set. In addition, the main arm mechanism 22 conveys the wafer W from the extension cooling unit (EXTCOL) to the extension unit (EXT), and mounts the wafer W on the mount base (not shown) in the extension unit (EXT).

Subsequently, the second sub-arm mechanism 24 accesses the extension unit (EXT) to load the wafer W in to the interface section 12. The second sub-arm mechanism 24 also loads the wafer W into the peripheral exposure device 23. The peripheral exposure device 23 performs an exposure process for the peripheral portion of the wafer W (step S9).

The second sub-arm mechanism 24 conveys the wafer W from the peripheral exposure device 23 to the wafer transfer base (not shown) in the exposure device (not shown). Note that when the exposure device cannot receive the wafer W, the controller 90 outputs a standby command to the second sub-arm mechanism 24 to cause it to temporarily store the wafer W in the buffer cassette BR (step S10).

The exposure device (not shown) performs an exposure process for the entire surface of the wafer W (step S11). When the wafer W is returned to the transfer base (not shown), the second sub-arm mechanism 24 conveys the wafer W from the wafer transfer base to the extension unit (EXT) belonging to the fourth process unit group G4. Note that when the developing unit (DEV) cannot receive the wafer W, the controller 90 output s a standby command to the second sub-arm mechanism 24 to cause it to temporarily store the wafer W in the buffer cassette BR (step S12).

When the wafer W is loaded into the extension unit (EXT), the main arm mechanism 22 accesses it to extract the wafer W therefrom. The main arm mechanism 22 then loads the wafer W into the developing unit (DEV) belonging to the first or second process unit group G1 or G2. In the developing unit (DEV), a developing solution is applied to the resist coating on the wafer W to develop the resist coating (step S13). Subsequently, a rinsing process is performed to rinse out the developing solution from the wafer surface with pure water (step S14).

The main arm mechanism 22 conveys the wafer W from the developing unit (DEV) to the postbaking unit (POBAKE) belonging to the third or fourth process unit group G3 or G4. In the postbaking unit (POBAKE), the wafer W is heated at 1000° C. for a predetermined period of time (step S15).

The main arm mechanism 22 conveys the wafer W from the postbaking unit (POBAKE) to the cooling unit (COL). In the cooling unit (COL), the wafer W is cooled to about 230° C. (step S16). The main arm mechanism 22 then conveys the wafer W from the cooling unit (COL) to the extension unit (EXT) belonging to the third process unit G3 (step S17).

Subsequently, the first sub-arm mechanism 21 accesses the extension unit (EXT) to extract the wafer W. The first sub-arm mechanism 21 moves in the X-axis direction while performing θ rotation, thereby transferring the wafer W to the transfer mount base 51 (step S18). The wafer W is extracted from the transfer mount base 51 by the lower holder 63 of the third sub-arm mechanism 61, and loaded into the final cleaning device 71 through the convey port 72 (step S19).

In the final cleaning device 71, high-pressure water jets are sprayed against the lower surface of the wafer W. With this operation, foreign substances adhering to the lower surface of the wafer W are removed, and the lower surface of the wafer W is finally cleaned (step S20). Thereafter, the wafer W is unloaded from the final cleaning device 71 by the upper holder 62 of the third sub-arm mechanism 61 (step S21), and the next wafer W is loaded into the final cleaning device 71 by the lower holder 63.

When the third sub-arm mechanism 61 transfers the wafer W having undergone the final cleaning process to the transfer mount base 51, the first sub-arm mechanism 21 accesses the transfer mount base 51 to extract the wafer W therefrom (step S22). The controller 90 determines whether the processes for the wafer W are complete (step S23). If NO in step S23, resist processes from step S4 to step S17 are executed. If YES in step S23, the first sub-arm mechanism 21 stores the wafer W in the cassette C on the cassette mount base 20 (step S24). When the cassette C is full of processed wafers W, the cassette C containing the wafers W is unloaded from the system. The clean wafers W are further subjected to the next process, e.g., an etching process.

According to the above embodiment, the final cleaning device 71 is installed in the space different from the spaces where the main arm mechanism 22 and the process unit groups G1 and G2 are installed. In addition, the structure of the driving system for the third sub-arm mechanism 61 is simpler than that of the main arm mechanism 22. For these reasons, foreign substances such as particles and organic components hardly adhere to the wafer W after the final cleaning process.

Since no chemical filter is required for the cleaning section 70, the quantity of chemical filters in the system decreases as a whole.

Since the wafer W can be temporarily held on the transfer mount base 51, the overall availability of the system increases.

In the above embodiment, one final cleaning device 71 is installed. However, a plurality of cleaning devices of the same type or different types may be installed. In addition, a plurality of cleaning devices may be stacked vertically in a multistage form. A plurality of transfer mount bases 51 may be arranged horizontally or vertically.

In addition, a BARC process device for performing a back face anti-reflection coating process may be installed beside the final cleaning device 71.

The substrates to be processed in the present invention include LCD substrates, CD substrates, photomasks, various printed boards, ceramic boards, and the like, as well as semiconductor wafers.

According to the present invention, a substrate having a clean lower surface having undergone a final cleaning process is stored in a cassette, and is conveyed to the next process. For this reason, no adverse effect is exerted on the next process, resulting in an increase in the yield of products. In addition, the quantity of chemical filters in the system can be decreased as a whole. Furthermore, since the transfer mount base can be used as a place where a substrate is temporarily held in a standby state, resist processes can be flexibly performed, resulting in an increase in throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A resist process method comprising, the steps of:
    (a) preparing a process section for processing a substrate, sub-arm mechanism for extracting the substrate from a cassette and conveying the substrate to said process section, a cleaning section for finally cleaning the substrate processed by said process section said cleaning section is arranged independently of the process section, a transfer mount base for transferring the substrate from said process section to said cleaning section, and means for receiving the substrate from said cleaning section and storing the substrate in a cassette;
    (b) extracting the substrate from the cassette;
    (c) conveying the extracted substrate to said process section;
    (d) including in said process section at least a process of developing the resist coated onto a front surface of the substrate;
    (e) transferring the substrate from said process section to said cleaning section after at least the developing process;
    (f) finally cleaning a reverse surface of the substrate by applying a cleaning solution to at least the reverse surface of the substrate in said cleaning section; and
    (g) storing the finally cleaned substrate in the cassette.

2. A method according to claim 1, wherein the step (f) comprises the step of cleaning only the reverse surface of the substrate by spraying jets of pure water against the reverse surface.

3. A method according to claim 1, wherein the step (f) comprises the step of cleaning both upper and lower surfaces of the substrate by spraying pure water against the upper and lower surfaces of the substrate.

4. A method according to claim 1, further comprising a step of judging whether the substrate is cleaned or not before the step (c).

5. A method according to claim 4, wherein when the substrate is judged to require cleaning before the step (c), the substrate is transferred to the cleaning section and pre-cleaned therein.

6. A method according to claim 5, wherein the step of pre-cleaning the substrate comprises the step of cleaning both upper and lower surfaces of the substrate by spraying pure water against the upper and lower surfaces of the substrate.

7. A method according to claim 1, wherein the step (d) further comprises a resist coating step of coating the substrate with the resist and a heat treatment step of heating and cooling the resist coated on the substrate.

8. A method according to claim 1, wherein the step (d) further comprises the step of performing an adhesion process for the substrate, cooling the substrate, prebaking the resist coating, cooling the resist coating, performing a peripheral exposure process for the resist coating, performing an entire surface exposure process for the resist coating, postbaking the resist coating after a developing process, and cooling the resist coating.

9. A resist process apparatus comprising:
    a cassette section into/from which a cassette containing a plurality of substrates is loaded/unloaded;
    a process section including at least developing means for developing the resist coated on a front surface of the substrate;
    first air-conditioning means for forming a down flow of clean air in said process section;
    a main arm mechanism for sequentially conveying the substrate in the process section;
    a sub-arm mechanism for extracting the substrates from the cassette of said cassette section one by one and directly or indirectly transferring the substrate to said main arm mechanism;
    a final cleaning section which is installed in a place different from a place where said process section is installed and performs a final cleaning process for the substrate by spraying a cleaning solution against the substrate the substrate being not transported to said final cleaning section by the main arm mechanism;
    second air-conditioning means for forming a down flow of clean air in said final cleaning section said down flow of clean air differing from the down flow of clean air formed by the first air-conditioning; and
    substrate transfer means for directly or indirectly transferring the substrate between said final cleaning section and said sub-arm mechanism, wherein
    said substrate transfer means transfers the substrate having undergone a process in said process section to said final cleaning section before the substrate is stored in the cassette of said cassette section, at least a reverse surface of the substrate is cleaned by spraying a cleaning solution against the reverse surface, and the cleaned substrate is stored in the cassette of said cassette section.

10. An apparatus according to claim 9, wherein said substrate transfer means comprises:
    a transfer mount base which is placed between said final cleaning section and said cassette section and on which a substrate is mounted by said sub-arm mechanism; and
    a convey arm mechanism for picking up the substrate from said transfer mount base and conveying the substrate to said final cleaning section.

11. An apparatus according to claim 10, wherein said convey arm mechanism is placed between said final cleaning section and said transfer mount base.

12. An apparatus according to claim 10, wherein said convey arm mechanism comprises a plurality of holder members for holding substrates.

13. An apparatus according to claim 12, wherein said convey arm mechanism comprises X-axis driving means for moving said holder members in an X-axis direction, Z-axis driving means for moving said holder members in a Z-axis direction, and θ rotation driving means for performing θ rotation of said holder members about a Z-axis.

14. An apparatus according to claim 10, wherein said transfer mount base is placed near an end portion of a path through which said sub-arm mechanism moves.

15. An apparatus according to claim 9, wherein said first air-conditioning means comprises an alkaline component removing chemical filter having a chemical filtering function, and said second air-conditioning means comprises a particle removing filter having a physical filtering function.

16. An apparatus according to claim 9, wherein said process section further comprises resist coating means for coating the substrate with the resist and heat treatment means for heating and cooling the substrate.

\* \* \* \* \*